United States Patent
Kamisako et al.

(10) Patent No.: US 7,662,355 B2
(45) Date of Patent: Feb. 16, 2010

(54) SILICON NANOSIZED LINEAR BODY AND A METHOD FOR PRODUCING A SILICON NANOSIZED LINEAR BODY

(75) Inventors: Koichi Kamisako, Fuchu (JP); Min Sung Jeon, Fuchu (JP)

(73) Assignee: National University Corporation Tokyo University of Agriculture and Technology, Fuchu-shi, Tokyo (JP)

(*) Notice: Subject to any disclaimer, the term of this patent is extended or adjusted under 35 U.S.C. 154(b) by 108 days.

(21) Appl. No.: 11/791,619

(22) PCT Filed: Nov. 29, 2005

(86) PCT No.: PCT/JP2005/022397

§ 371 (c)(1),
(2), (4) Date: Aug. 2, 2007

(87) PCT Pub. No.: WO2006/057464

PCT Pub. Date: Jun. 1, 2006

(65) Prior Publication Data

US 2008/0044336 A1    Feb. 21, 2008

(30) Foreign Application Priority Data

Nov. 29, 2004 (JP) ............................. 2004-345041

(51) Int. Cl.
*C01B 33/02* (2006.01)
*B01J 21/00* (2006.01)

(52) U.S. Cl. .................. 423/349; 977/762; 502/232; 502/240

(58) Field of Classification Search .................. 423/348, 423/349; 502/232, 240, 355; 977/762, 773
See application file for complete search history.

(56) References Cited

U.S. PATENT DOCUMENTS

2003/0039602 A1* 2/2003 Sharma et al. ............. 423/349

FOREIGN PATENT DOCUMENTS

| JP | H11-349321 A | 12/1999 |
|----|--------------|---------|
| JP | 2003-142680 A | 5/2003 |
| JP | 2004-296750 A | 10/2004 |
| JP | 2005-112701 A | 4/2005 |
| JP | 2005-139044 A | 6/2005 |

* cited by examiner

*Primary Examiner*—Timothy C Vanoy
*Assistant Examiner*—Richard M Rump
(74) *Attorney, Agent, or Firm*—Manabu Kanesaka

(57) ABSTRACT

Silicon nanosized linear bodies with different structures and properties can be produced by appropriately setting the condition for the pretreatment by a radical (reaction condition of a hydrogen radical, e.g. concentration). A silicon nanosized linear body is produced from a silicon radical active species in the presence of a catalyst. The catalyst is at least one selected from Ga, Ga compound, In, In compound, Tl and Tl compound that are pretreated by a radical.

3 Claims, 14 Drawing Sheets

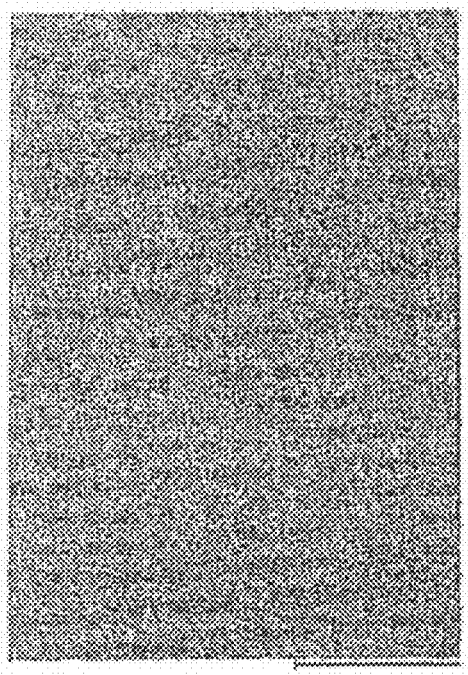 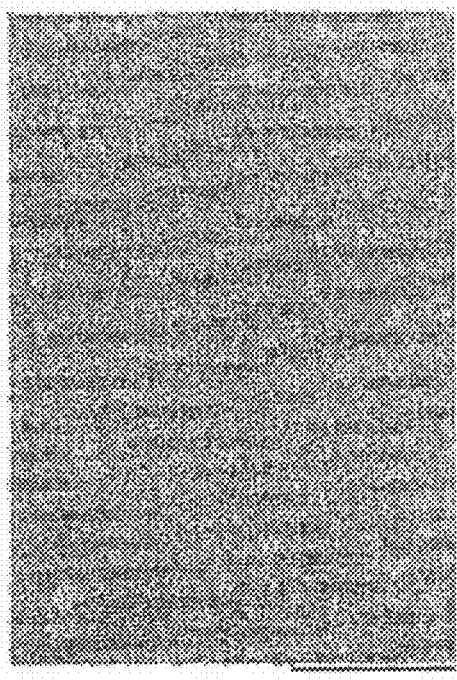
Fig. 2(A)  5.0 μm   Fig. 2(B)  0.5 μm

Fig. 3(A) 0.8 μm
Fig. 3(B) 0.2 μm
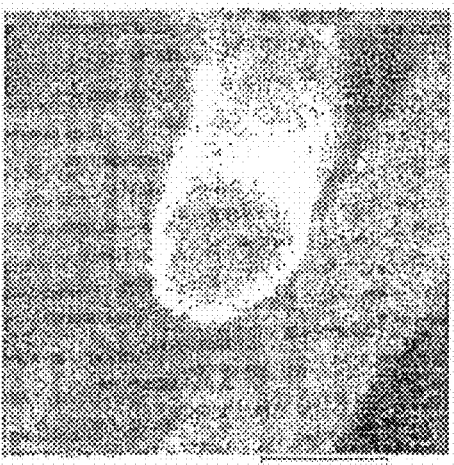
Fig. 3(C) 0.08 μm

ITO 350°C

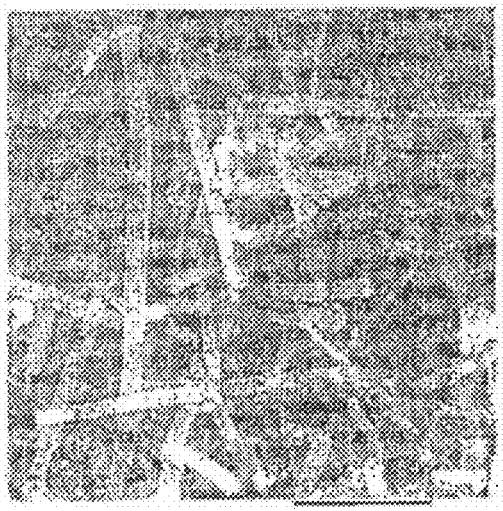
Fig. 5(A)  0.8 μm
Fig. 5(B)  0.2 μm
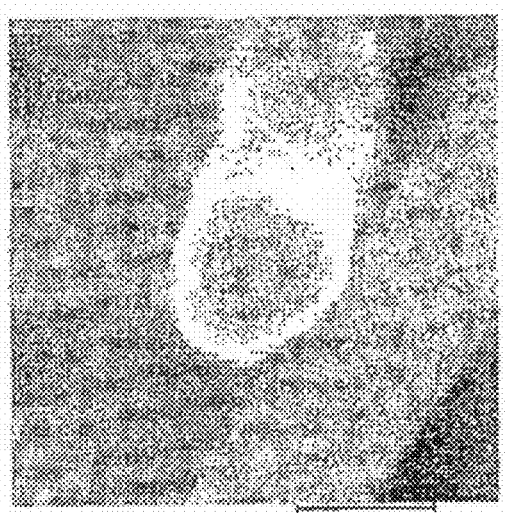
Fig. 5(C)  0.08 μm

SILICON NANOSIZED LINEAR BODY AND A METHOD FOR PRODUCING A SILICON NANOSIZED LINEAR BODY

TECHNICAL FIELD

This invention relates to a silicon nanosized linear body and a method for producing a silicon nanosized linear body from a silicon compound using a pretreated IIIB group metal of the periodic system or the compound thereof that are pretreated by a radical as a catalyst.

BACKGROUND ART

Various methods for producing carbon nanotubes and nanowires are known and the various applications are proposed. Production of non-carbon nanotubes and nanowires are being attempted.

For example, "Applied Physics Letters Volume 79 Number 10, 3 Sep. 2001" (pages 1546-1548) discloses a method for growing silicon nanowires from a silicon alloy ball. This method makes hydrogen radical react with silicon hydrogen compounds (SiHx) in presence of Ga as a catalyst, takes xH out of SiHx to produce a Ga—Si alloy and grows silicon wires from the alloy. This reaction is expressed by the following equation.

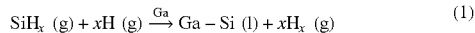

$$\text{SiH}_x \text{ (g)} + x\text{H (g)} \xrightarrow{\text{Ga}} \text{Ga} - \text{Si (l)} + x\text{H}_x \text{ (g)} \quad (1)$$

The diameter of the produced silicon nanowire dx is expressed by the following equation.

$$d_x = \frac{4\Omega\alpha}{RT \times \ln\left(\frac{C}{C_x}\right)} \quad (2)$$

where,
R: gas constant
T: temperature
$\Omega$: molar volume
$\alpha$: surface free energy
C: silicon concentration in an alloy
Cx: equilibrium concentration Japanese laid-open patent application No. 2000-48929 discloses a method for growing a silicon nanotube from an alloy ball by separating silicon out from a droplet (melt state) alloy of Au and silicon.

In this production method, a $SiO_2$ film 92 is formed on the surface of a silicon substrate 91 as shown in FIG. 14(A), and a circular aperture 93 is formed on the $SiO_2$ film 92 by etching as shown in FIG. 14(B). Au is deposited in the circular aperture 93 to 2-10 nm thickness by sputtering. Au particles are generated in each circular aperture 93 by heating the silicon substrate 91 to 650-800° C.

The Au particle melts and becomes a droplet 94 of Au—Si alloy ball by reacting with the silicon substrate 91 as shown in FIG. 14(C). A silicon contained compound gas, e.g. $SiH_4$, $SiHCl_3$, $SiH_2Cl_2$, $Si_2H_6$ is integrated into the Au—Si alloy ball (droplet 94).

The patent document 1 teaches that the silicon in the Au—Si alloy ball (droplet 94) separates out and a silicon nanotube 95 grows from the round of the droplet as shown in FIG. 14(D). In the patent document 1, the silicon nanotube 95 is "fullerene" and the silicon nanotube in this document is considered "silicon nanowire" in actual.

DISCLOSURE OF INVENTION

The diameter dx of a silicon nanowire produced by the method shown in the non-patent document 1 depends on $\Omega$, $\alpha$, C, $C_x$ as above mentioned and therefore the production flexibility is low. A silicon wire is useful for nanosized conductive material for example, however the size control is not easy by the method in the non-patent document 1.

The method of the non-patent document 1 can produce only one silicon nanotube for each circle aperture on the $SiO_2$ film. Silicon nanotubes are useful for supporting gases and metals, however the production by the method of the non-patent document 1 is not efficient.

The purpose of the present invention is to provide a method for producing a silicon nanosized linear body from a silicon compound using a pretreated IIIA group metal of the periodic system or the compound thereof that are pretreated by a radical as a catalyst.

The silicon nanosized linear body according to the present invention includes a tubular silicon nanotube, a non-tubular (filled) silicon nanowire and silicon nanostring comprising continuous cups or hollow cells.

The pretreatment by a radical according to the present invention includes reaction of a hydrogen radical with a catalyst primary material.

The method for producing a silicon nanosized linear body according to the present invention may include the step for performing a pretreatment of the catalyst primary material by the hydrogen radical in the production system for the silicon nanosized linear body, the step for producing a silicon radical active species by supplying silicon compound into the production system while continuously supplying the hydrogen radical, and the step for forming the silicon nanosized linear body from the silicon radical active species.

The method according to the present invention may use an oxide, a hydride, a bromide, a chloride, an iodide, a hydroxide, a nitric compound, a sulfide, a nitric acid compound, an organic compound, etc. as the Ga compound, the In compound, the Tl compound.

The Ga compound includes gallium oxide(II), gallium oxide(III), gallium bromide, gallium chloride, gallium iodide, gallium hydroxide, gallium nitrate, gallium sulfate, gallium sulfide, etc.

The In compound includes indium oxide(II), indium oxide (III), indium bromide, indium chloride(I), indium chloride (II), indium chloride(III), indium cyanide, indium fluoride, indium hydroxide, indium iodide, indium nitrate, indium sulfate, indium sulfide, etc.

The Tl compound includes thallium oxide(II), thallium oxide(III), thallium bromide, thallium chloride(I), thallium chloride(II), thallium chloride(III), thallium cyanide, thallium fluoride, thallium hydroxide, thallium iodide, thallium nitrate, thallium sulfate, thallium sulfide, etc.

The Al compound includes aluminum oxide(II), aluminum oxide(III), aluminum bromide, aluminum chloride(I), aluminum chloride(II), aluminum chloride(III), aluminum cyanide, aluminum fluoride, aluminum hydroxide, aluminum iodide, aluminum nitrate, aluminum sulfate, aluminum sulfide, etc.

Other elements in the IIIB group of the periodic system, e.g. B and the compounds thereof can be used as a catalyst in the present invention as well as Ga, In, Tl and Al, The hydrogen radical in the present invention can be produced from $H_2$ and other hydrogen radical source compounds ($H_2O$, a hydrogen radical source compound or a relative lower organic compound of 1-9 carbon number like an alkane, e.g. methane, ethane, propane, butane, pentane, hexane, heptane, octane, nonane, decane; a monovalent alcohol, e.g. methanol, ethanol, 1-propanol, 2-propanol, 1-butanol, 2-butanol, 2-methyl-1-propanol, t-butyl alcohol, 1-pentanol, 2-pentanol, 3-pentanol, 2-methyl-1-butanol, 3-methyl-1-butanol, 2,2,-dimethyl-1-propanol; an ether, e.g. dimethyl ether, methyl-n-propyl ether, methyl-I-propyl ether, n-butyl methyl ether, sec-butyl methyl ether, tert-butyl methyl ether, diethyl ether, ethyl-n-propyl ether, ethyl-i-propyl ether; a carboxylic acid, e.g. formic acid, acetic acid, propionic acid, butyric acid, valeric acid; an ester, e.g. methyl formate, ethyl formate, n-propyl formate, i-propyl formate, n-butyl formate, sec-butyl formate, tert-butyl formate, methyl acetate, ethyl acetate, n-propyl acetate, i-propyl acetate, n-butyl acetate, sec-butyl acetate, methyl propionate, ethyl propionate, n-propyl propionate, i-propyl propionate, n-butyl propionate, sec-butyl propionate, methyl butyrate, n-propyl butyrate, i-propyl butyrate, n-butyl butyrate, sec-butyl butyrate, tert-butyl butyrate, methyl valerate, ethyl valerate, n-propyl valerate, i-propyl valerate, n-butyl valerate, sec-butyl valerate, tert-butyl valerate; a ketone, e.g. acetone, methyl ethyl ketone, diethyl ketone).

In the present invention, the silicon radical active species can be produced from a silicon compound. $SiH_4$, $Si_2H_6$, $Si_3H_8$, $SiHCl_3$, $SiH_2Cl_2$, and $SiHF_8$ are used as the silicon compound.

The present invention can be practiced using a CVD (Chemical Vapor Deposition) apparatus.

According to the present invention, at least one of Ga, Ga compound, In, In compound, Tl, Tl compound are pretreated. It is considered that the catalyst enters into a radical condition by the pretreatment.

A silicon radical active species is produced by making a hydrogen radical react with a silicon compound. In the reaction, it is considered that the hydrogen radical takes off non-silicon atoms from the silicon compound, a "nucleus", or an active species is produced by binding four-membered ring or six-membered ring silicon compounds and a silicon nanosized linear body is produced from the "nucleus".

The silicon nanosized linear body usually grows maintaining the catalyst at its one end. It is considered that the silicon nanosized linear body can grow maintaining the catalyst which originally existed on the substrate at its one end or can grow maintaining a closed condition of a tube end from the catalyst on the substrate. The hydrogen radical can be produced by microwave exposure, plasma discharge (high frequency glow discharge, for example), laser exposure, ultraviolet ray exposure of $H_2$ or a hydrogen radical source compound. The hydrogen radical can be excited (at a condition where the electron energy level is higher than the ground state) or unexcited.

As a result of the reaction of a silicon compound with a hydrogen radical, a silicon radical active species and a hydrogen radical are produced. The silicon radical active species becomes a silicon polymer by reacting with a hydrogen radical.

According to the present invention, it is considered that the catalyst enters in a radical condition when Ga, Ga compound, In, In compound, Tl, Tl compound, etc. are reacted with a hydrogen radical. By appropriately changing the time for reacting the hydrogen radical with the catalyst, silicon nanosized linear bodies can be produced with different structures (diameter, length, etc.) or different properties (e.g. electric properties).

The catalyst to use can be formed by deposition on a glass substrate or a $SiO_2$ substrate, for example and plastics can be used as the substrate when the melting point of the catalyst is low.

According to the present invention, it is preferable to adjust the amount of the catalyst so that the catalyst forms an island by melting. It is enough to grow the silicon nanosized linear body when the catalyst surface is formed in a spotty fashion or roughened.

When the concentration of the silicon compound is too low at the catalyst neighborhood the growing speed of the silicon nanosized linear body becomes slow, and when the concentration is too high the amorphous silicon tends to adhere on the round of the silicon nanosized linear body. The silicon nanosized linear body with adhered amorphous silicon has poor properties (e.g. electric properties). Considering this circumstance, the silicon compound flow that is supplied to the reacting chamber is appropriately adjusted.

When the concentration of the hydrogen radical at the catalyst neighborhood is too low the reaction with the silicon compound is not enough performed, and the concentration is too high the breaking of the grew silicon nanosized linear body is concerned. The concentration of the hydrogen radical depends on the flow volume of the hydrogen radical source compound, the microwave exposure condition, the plasma discharge condition, the laser exposure condition, the ultraviolet ray exposure condition, etc. because the hydrogen radical is produced from a hydrogen radical source compound. Considering this circumstance the condition of the flow volume of the hydrogen radical source compound, the microwave exposure, the plasma discharge, the laser exposure, the ultraviolet ray exposure, etc. are appropriately adjusted.

The pressure at the catalyst neighborhood during the reaction of the silicon compound with the hydrogen radical depends on the concentration of the silicon radical of the silicon compound at the catalyst neighborhood, the concentration of the hydrogen radical, the unreacted hydrogen radical source compound, etc. Considering this circumstance, the pressure in the reacting chamber is appropriately adjusted so as not to interrupt production of a silicon nanotube. It is preferable to determine the pressure in the reacting chamber depending on the apparatus, e.g. the apparatus specification when a silicon nanosized linear body is produced by a CVD apparatus.

It is considered that the optimum temperature at the catalyst neighborhood is related to the melting point of the catalyst under the reacting chamber pressure. The substrate temperature is set appropriately considering this circumstance. It is preferable to set to the temperature that is close to the catalyst melting point.

When the reaction time of the silicon compound and the hydrogen radical (time for reaction by contacting the silicon compound and the hydrogen radical with the substrate) is too short, the silicon nanosized linear body cannot grow enough, and the reaction time is too long, the tendency of the amorphous silicon to adhere on the round of the silicon nanosized linear body becomes significant. As mentioned before, the silicon nanosized linear body with the adhered amorphous silicon has poor properties (e.g. electric characteristics).

According to the present invention, the silicon compound can be reacted with the hydrogen radical in presence of the catalyst by adding a dopant element atom or the compound thereof to the silicon compound. A semiconductor nanosized linear body can be produced by adding the dopant.

A PN type semiconductor nanosized linear body can be produced by growing a silicon nanosized linear body for a predetermined time period to a predetermined length adding P type dopant to the silicon compound, and then growing a silicon nanosized linear body for a predetermined time period to a predetermined length adding N type dopant to the silicon compound An N type semiconductor nanosized linear body can be produced by growing a silicon nanosized linear body adding N type dopant to the silicon compound. The N type semiconductor nanosized linear body can be used as an electron emitting source.

By practicing the above mentioned method, the silicon nanosized linear body according to the present invention can include no catalyst and O. The silicon nanosized linear body according to the present invention can be produced using at least one selected from Ga, Ga compound, In, In compound, Tl, Tl compound, Al and Al compound as a catalyst.

BRIEF DESCRIPTION OF DRAWINGS

FIG. 2(A) shows a micrograph of the glass substrate with the deposited catalyst before the pretreatment according to the embodiment 1 and (B) shows a micrograph of the glass substrate with the deposited catalyst after the pretreatment according to the embodiment 1.

FIG. 3 shows a micrograph by a field emission scanning electron microscope (SEM) and a EDX spectrum of the silicon nanosized linear body according to the embodiment 1

FIG. 5(A)-(C) respectively shows a micrograph of the nanosized linear bodies according to the embodiment 2.

BEST MODE FOR CARRYING OUT THE INVENTION

One of the embodiments of the present invention will be explained below. The scope of the present invention should not be limited to the following embodiments.

[Production Apparatus, Production Condition, etc.]

Figure 1:
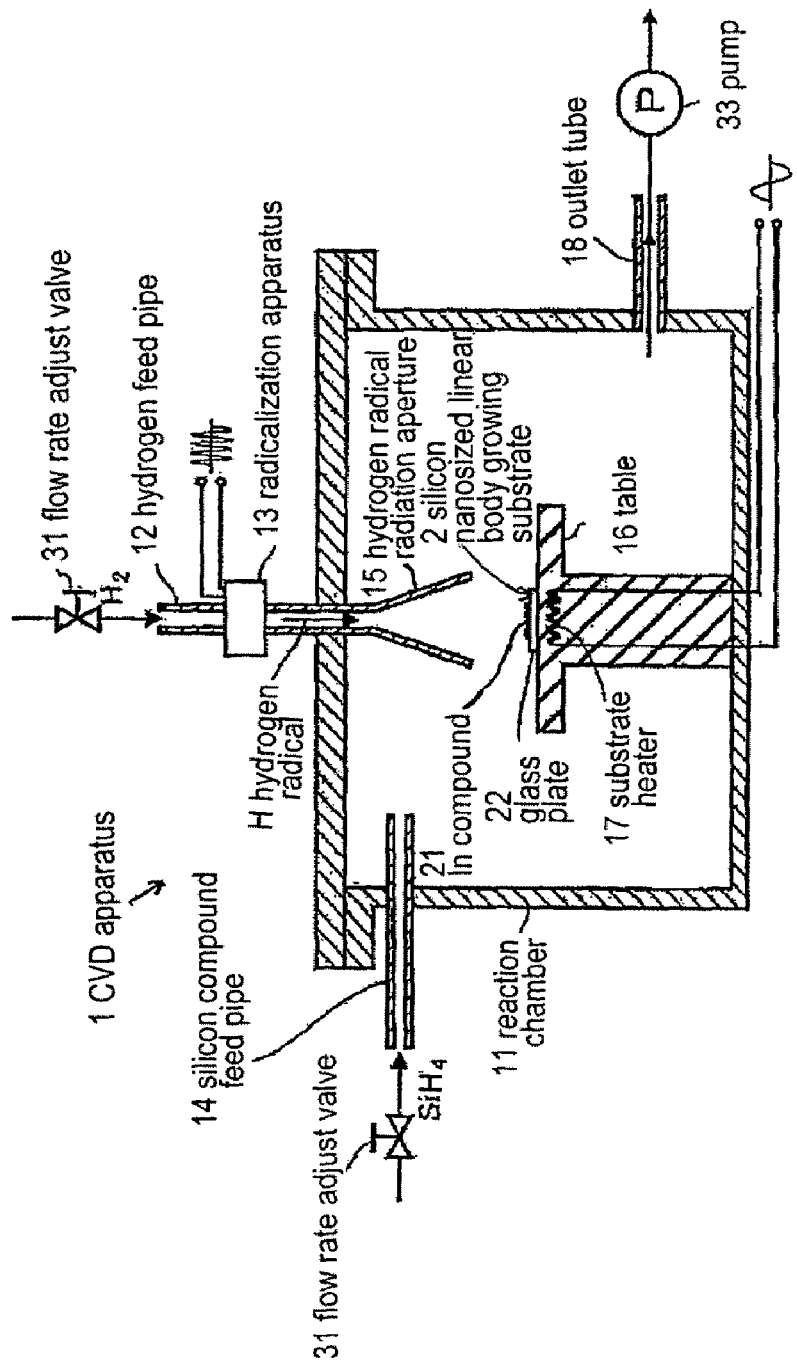
FIG. 1 shows a CVD apparatus for producing a silicon nanosized linear body according to the present invention.

FIG. 1 shows a CVD apparatus for producing a silicon nanosized linear body according to the present invention. In FIG. 1, a CVD apparatus 1 includes a reaction chamber 11, a hydrogen feed pipe 12, a radicalization apparatus (e.g. microwave radiation apparatus) 13, a silicon compound feed pipe 14, a hydrogen radical radiation aperture 15, a table 16, a substrate heater 17 in the table 16, and an outlet tube 18.

$H_2$ gas flows in the hydrogen feed pipe 12 and $SiH_4$ gas flows in the silicon compound feed pipe 14. A silicon nanosized linear body growing substrate 2 is mounted on the table 16. The silicon nanosized linear body growing substrate 2 is a glass plate 22 with a 10-100 nm film of In compound ($In_2O_3$/Sn:ITO) 21 as shown in FIG. 2(A), (B).

The flow rate of $H_2$ in the hydrogen feed pipe 12 is adjusted by a flow adjust valve 31. The radicalization apparatus 13 produces a hydrogen radical (H in FIG. 1) from $H_2$. The radicalization apparatus 13 generates a plasma from part of $H_2$ by 40 [W] microwave and produces a hydrogen radical.

The hydrogen radical is fed to the hydrogen radical radiation aperture 15 in the reaction chamber 11. Since not all $H_2$ in the hydrogen feed pipe 12 do not become hydrogen radical usually, the flow rate of the hydrogen radical is substantially adjusted by appropriately adjusting the flow rate of $H_2$. In this embodiment, the flow rate of $H_2$ is set to 120 [sccm].

The $SiH_4$ is fed into the reaction chamber 11. The flow rate of $SiH_4$ in the silicon compound hydrogen feed pipe 14 is adjusted by a flow rate adjust valve 32. In this embodiment, the flow rate of $SiH_4$ is set to 12 [sccm]

[Treatment Prior to Reaction]

As the treatment prior to the reaction, the silicon nanosized linear growing substrate 2 on the substrate mount table 16 is heated to 350° C. and only the hydrogen radical is fed into the reaction chamber 11. The pressure in the reaction chamber 11 is reduced to about 0.4 [Torr] by aspirating the gas in the reaction chamber 11 from the outlet tube 18 using a pump 33.

Under the above described condition, $SiH_4$ fed into the reaction chamber 11 and the hydrogen radical radiated from the hydrogen radical radiation aperture 15 contact with $In_2O_3$/Sn (ITO) 21 on the silicon nanosized linear body growing substrate 2 on the substrate mount table 16. FIG. 2(A), (B) show the micrographs of the substrate before and after the treatment.

EMBODIMENTS 1-3

The silicon nanosized linear bodies are produced by contacting the hydrogen radical and $SiH_4$ with the catalyst $In_2O_3$/Sn(ITO) on the growing substrate 2 for 2 hours at 350° C. in the embodiment 1 and 450° C. in the embodiment 2. The result of the production is shown in Table 1.

Figure 4:
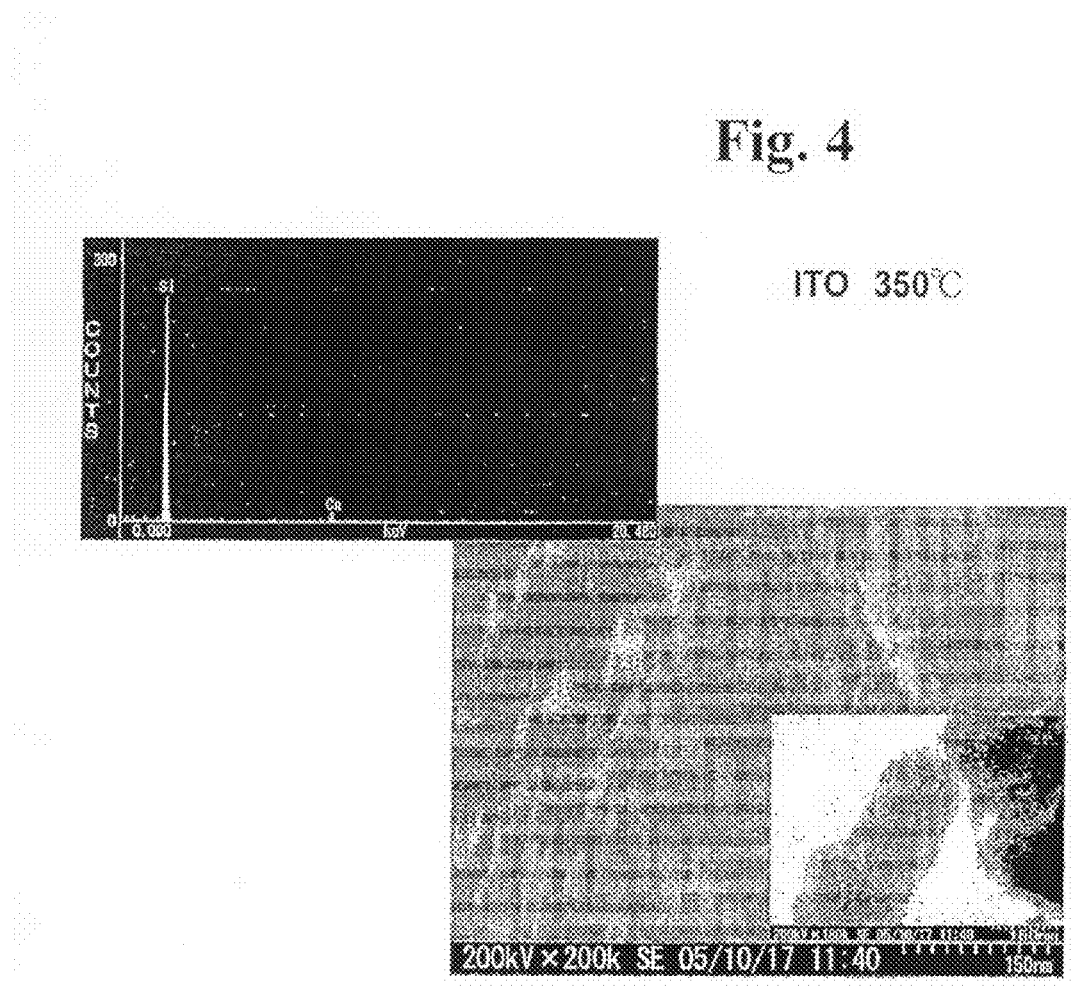
FIG. 4 shows a micrograph by a field emission scanning electron microscope (SEM) and a EDX spectrum of the silicon nanosized linear body according to the embodiment 2

FIG. 3 and FIG. 4 respectively shows a micrograph by a field emission scanning electron microscope (SEM) and EDX spectrum of the silicon nanosized linear bodies according to the embodiment 1 and 2. It is understood form FIGS. 3 and 4 that the silicon nanosized linear bodies are consist of Si only and do not substantially include catalyst (In). The peak of Cu is observed, however this Cu separated out from the mesh for holding the sample.

Figure 6:
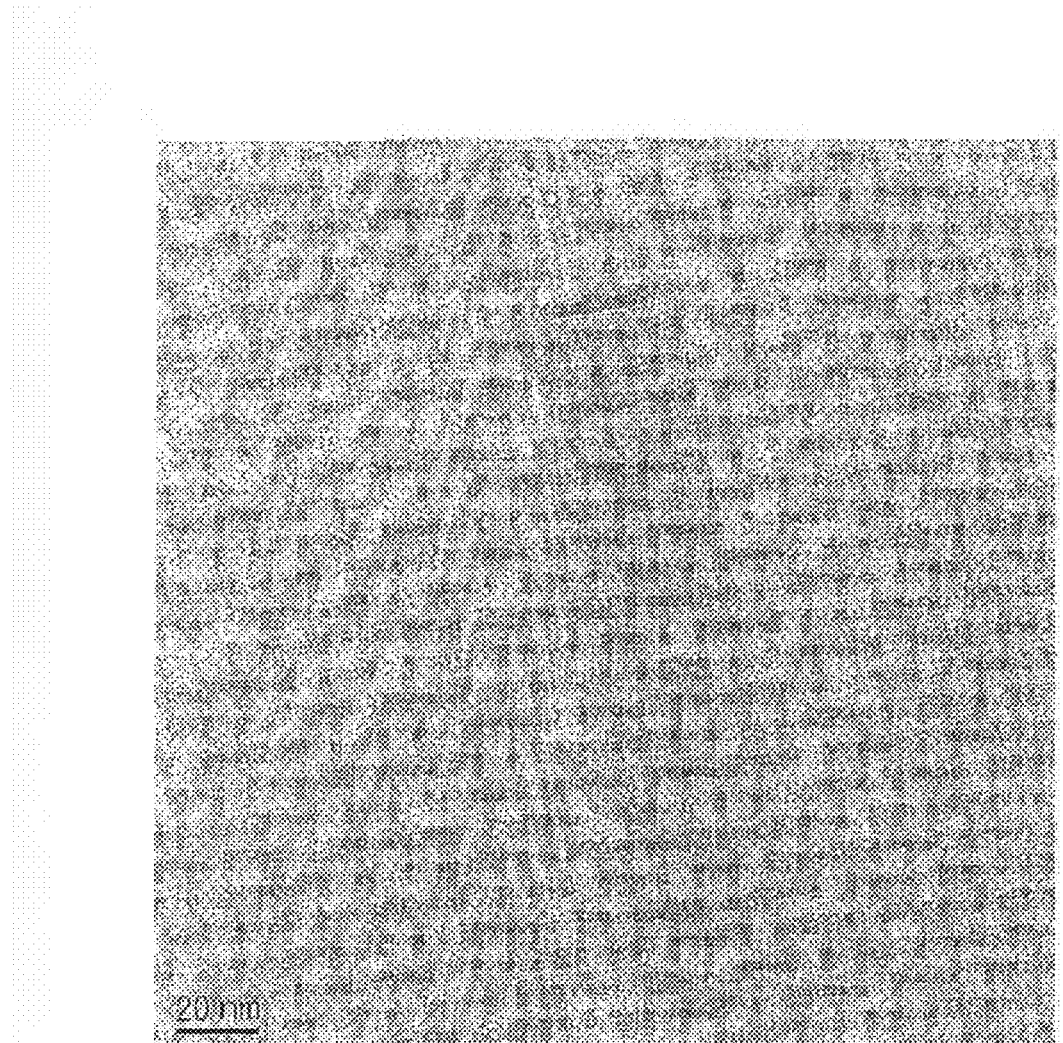
FIG. 6 shows a closeup view of a single nanosized linear body according to the embodiment 2.

FIGS. 5(A), (B) and (C) show closeup views of the produced silicon nanosized linear bodies in the embodiment 2. FIG. 6 shows a closeup view of a single nanosized linear body according to the embodiment 2.

TABLE 1

| Embodiment run. | Metal compound | Hydrogen radical source | Aging time (h) | Temperature (° C.) | Pole |
|---|---|---|---|---|---|
| Embodiment 1 | In$_2$O3/Sn | H$_2$ | 2.0 | 350 | Produced |
| Embodiment 2 | In$_2$O3/Sn | H$_2$ | 2.0 | 450 | Produced |
| Embodiment 3 | In$_2$O3/Sn | H$_2$O | 2.0 | 350 | Produced |
| Embodiment 4 | In | H$_2$ | 2.0 | 400 | Produced |
| Embodiment 5 | In | H$_2$ | 2.0 | 480 | Produced |
| Embodiment 6 | Ga | H$_2$ | 2.0 | 480 | Produced |
| Embodiment 7 | Al | H$_2$O | 2.0 | 450 | Produced |
| Comparative Example 1 | Pt | H$_2$ | 2.0 | 350 | Not produced |

[Observation and Valuation of the Silicon Nanosized Linear Body]

We observed and evaluated the produced silicon nanosized linear body using a field emission scanning electron microscope (SEM). As the microscope, Hitachi " S-4500 field emission scanning electron microscope was used. The measurement condition was the resolution of 1.5 nm (accelerating voltage: 15 kV) and the magnification ratio at the high magnification mode of 50-500,000. The diameter of the produced silicon nanosized linear body was measured from the electron micrograph.

[Yield Point of the Silicon Nanosized Linear Bodies]

The yield point of the produced silicon nanosized linear bodies was obtained from the ratio of the pole area to the unit area (hereinafter, called area density, n/cm$^2$). The area density was derived from the measurement result of an electron micrograph of the silicon nanosized linear bodies.

It is clear from Table 1 that a silicon nanosized linear body (tube) can be produced by using the pretreated In, Ga metals and the compound thereof as the catalyst.

EMBODIMENT 3

Table 1 shows the condition and the valuation of the embodiment 3 which used H$_2$O in place of the hydrogen radical in the embodiment 1.

EMBODIMENTS 4-7 AND COMPARATIVE EXAMPLE 1

The silicon nanosized linear bodies were produced using the various metal catalysts and the temperatures listed in Table 1. The embodiments 4, 5, 6 and 7 show the reaction conditions and the presence or absence of the silicon nanosized linear bodies when In, Ga and Al were used as the catalysts. The comparative example 1 shows the reaction condition and the presence or absence of the silicon nanosized linear bodies when Pt was used as the catalyst. Table 1 shows the reaction conditions and the presence or absence of the silicon nanosized linear bodies for the embodiments 4-7 and the comparative example 1.

Figure 7:
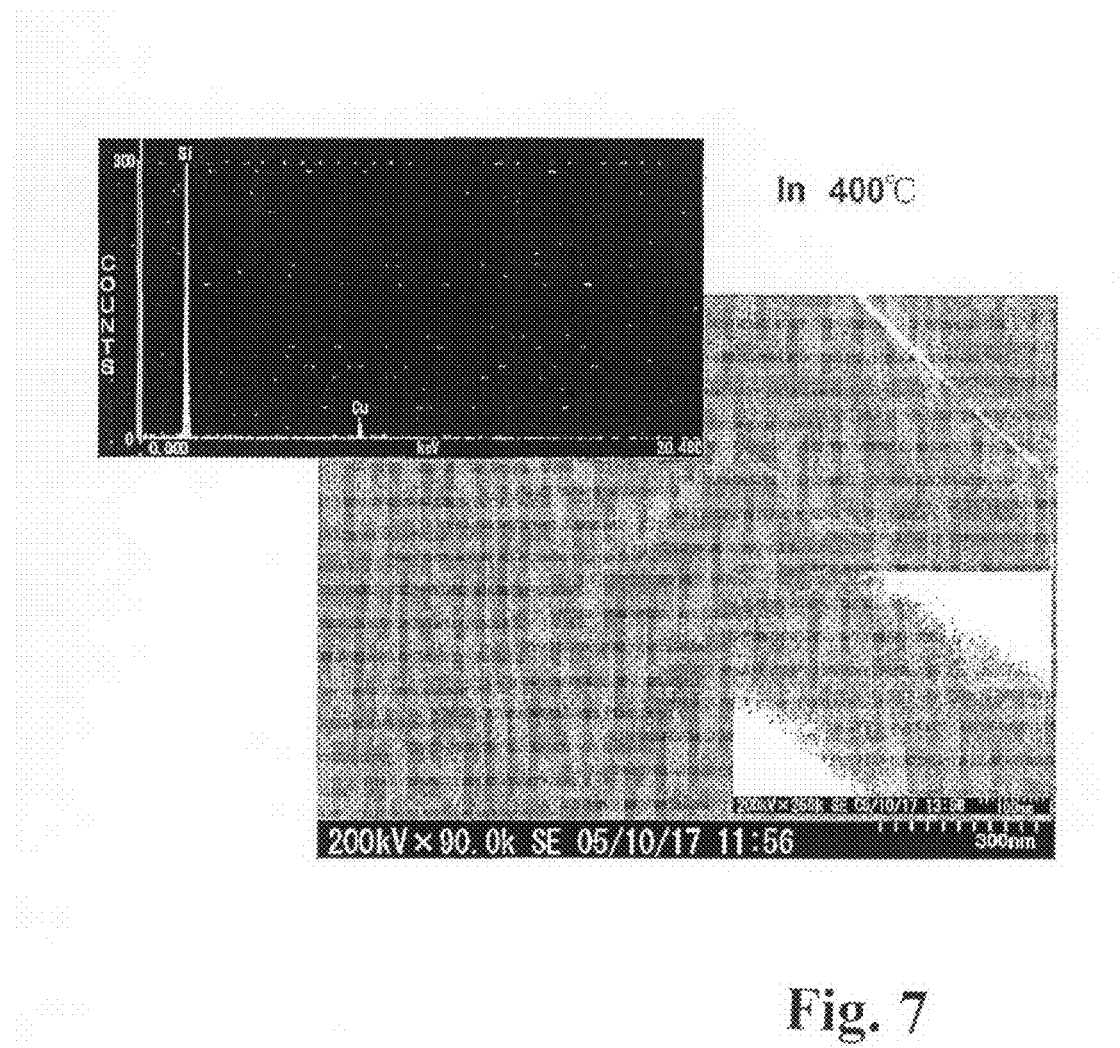
FIG. 7 shows a micrograph by a field emission scanning electron microscope (SEM) and a EDX spectrum of the silicon nanosized linear body according to the embodiment 4.

FIG. 7 shows a micrograph by a field emission scanning electron microscope (SEM) and a EDX spectrum of the silicon nanosized linear body according to the embodiment 4. It is understood from the EDX spectrum of the silicon nanosized linear body that the silicon nanosized linear body substantially consists of Si only.

Figure 8:
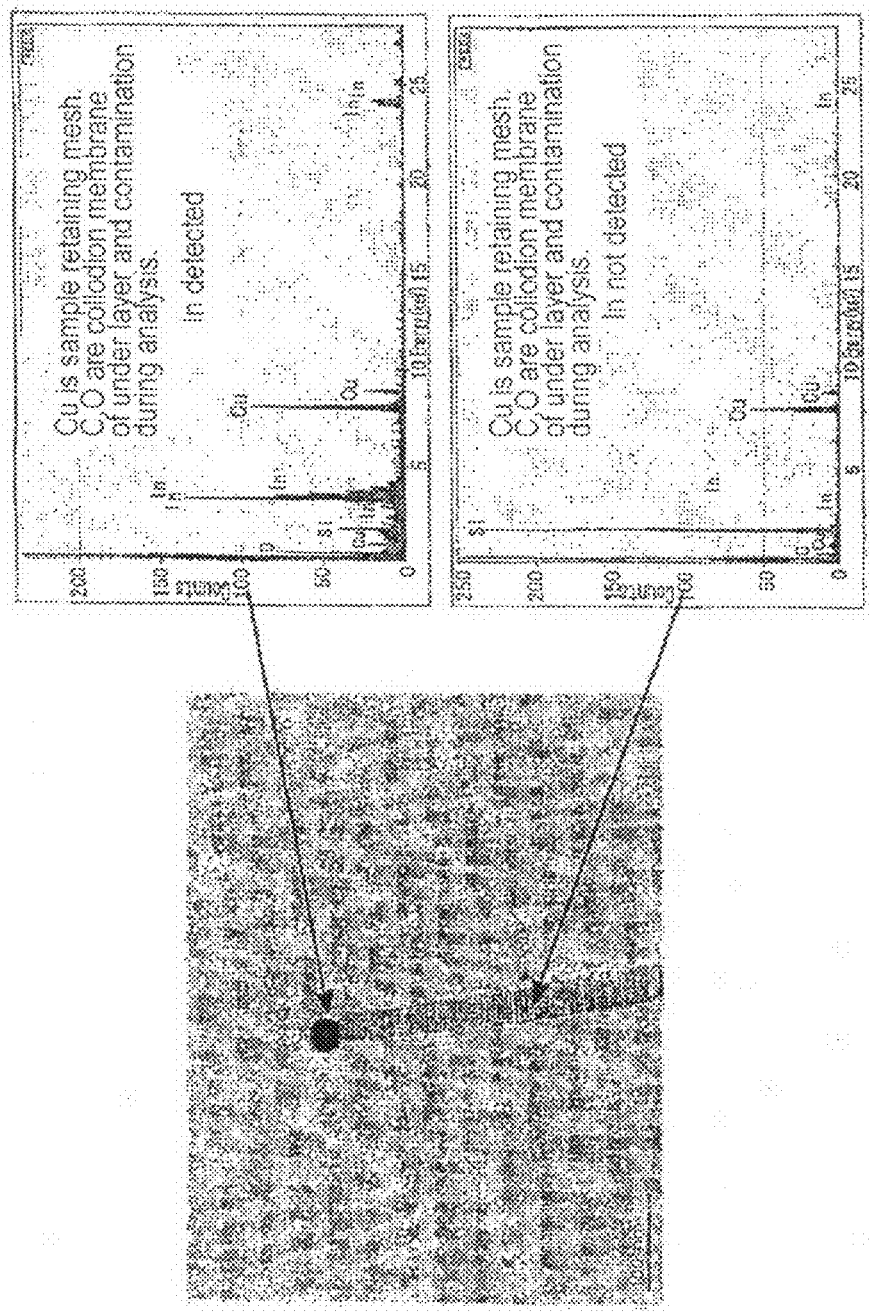
FIG. 8 shows a micrograph by a field emission scanning electron microscope (SEM) and a EDX spectrum of the silicon nanosized linear body and a catalyst (In) according to the embodiment 4.

FIG. 8 shows a micrograph by a field emission scanning electron microscope (SEM) and a EDX spectrum of the silicon nanosized linear body having the catalyst (In) at its end.

Figure 9:
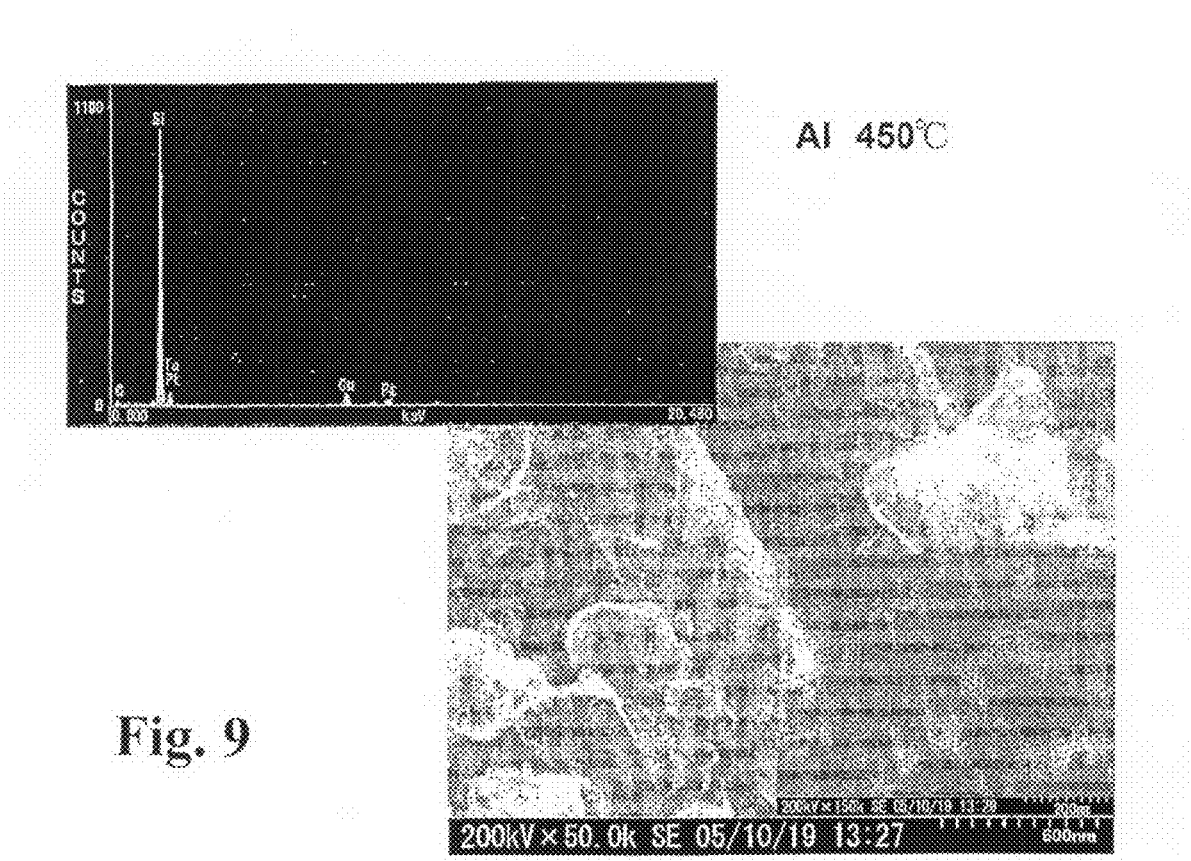
FIG. 9 shows a micrograph by a field emission scanning electron microscope (SEM) and a EDX spectrum of the silicon nanosized linear bodies according to the embodiment 7.

FIG. 9 shows a micrograph by a field emission scanning electron microscope (SEM) and a EDX spectrum of the silicon nanosized linear bodies according to the embodiment 7. It is understood from the EDX spectrum of the silicon nanosized linear body that the silicon nanosized linear body substantially consists of Si only.

As shown in Table 1, a silicon nanosized linear body (tube) can be produced by using pretreated In, Ga, Al metals and the compound thereof as a catalyst.

Figure 10:
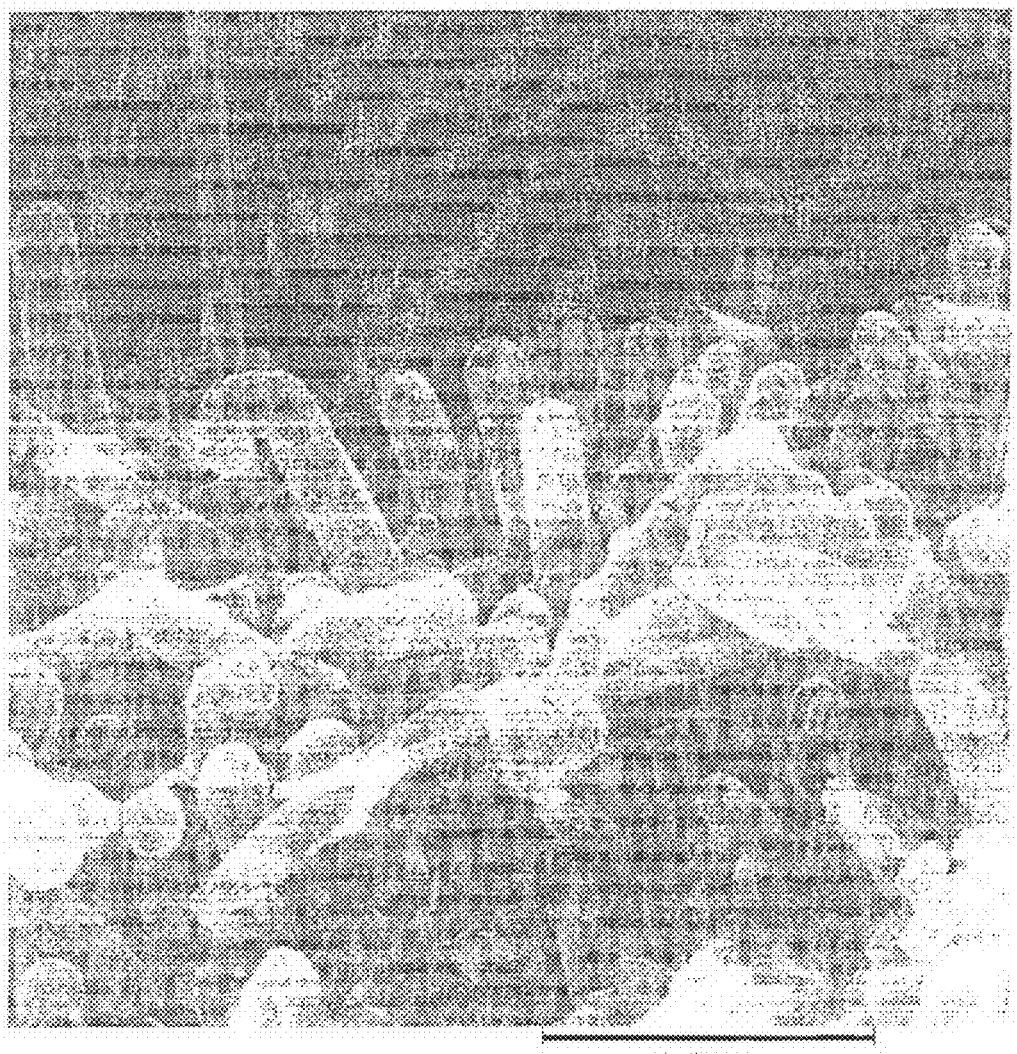
FIG. 10 is a SEM picture of the silicon nanosized linear bodies with the shape of tubes that were developed by growing Si using Al as a catalyst at the low temperature of 450° C.

FIG. 10 is SEM pictures (a, b, c) of the silicon nanosized linear bodies with the shape of tubes that were developed by growing Si using Al as a catalyst at the low temperature of 450° C. (the melting point of Al: 660° C.).

Figure 11:
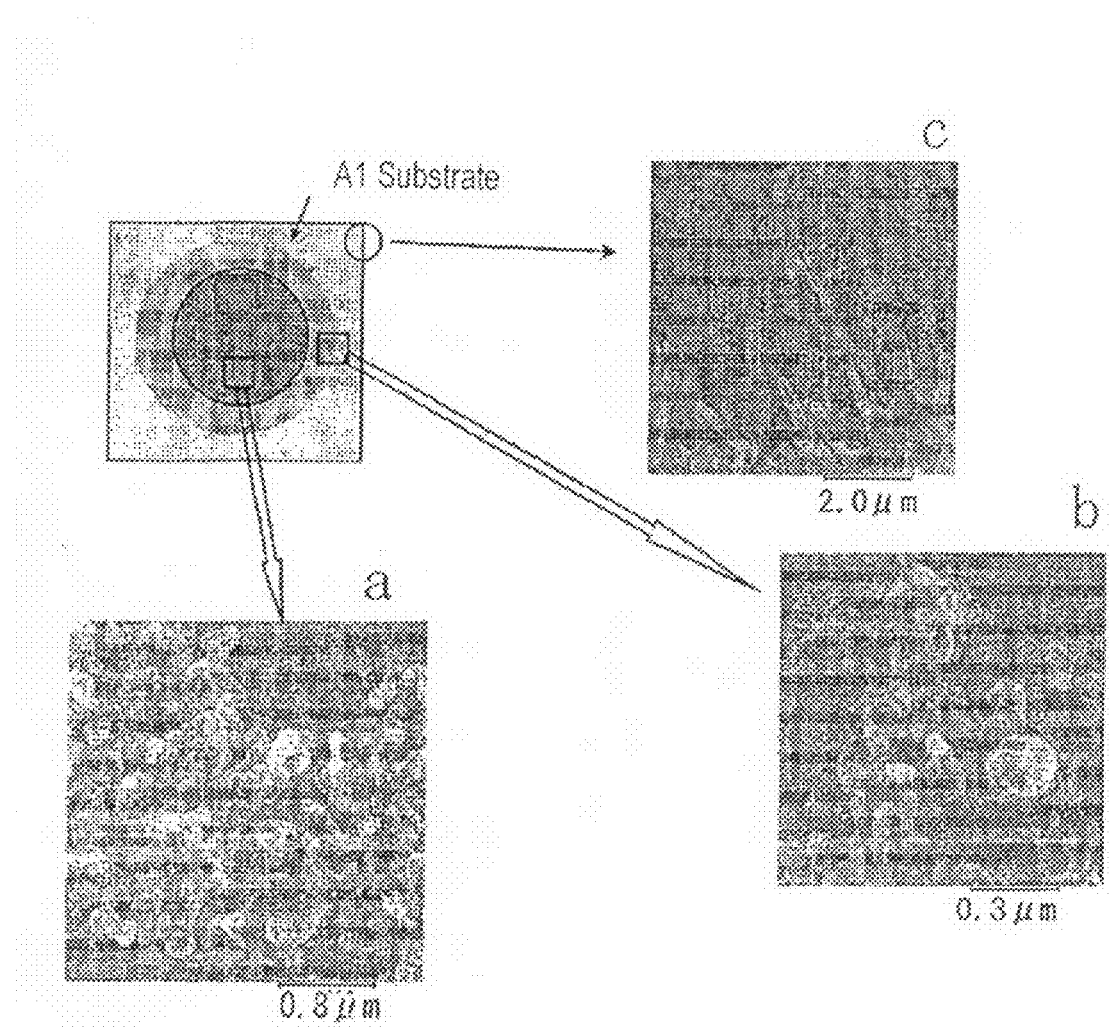
FIG. 11 shows a picture indicating that the silicon nanosized linear bodies have the different shapes between the portions depending on the distance to the reaction center when Si is grown on the Al substrate.
Figure 12:
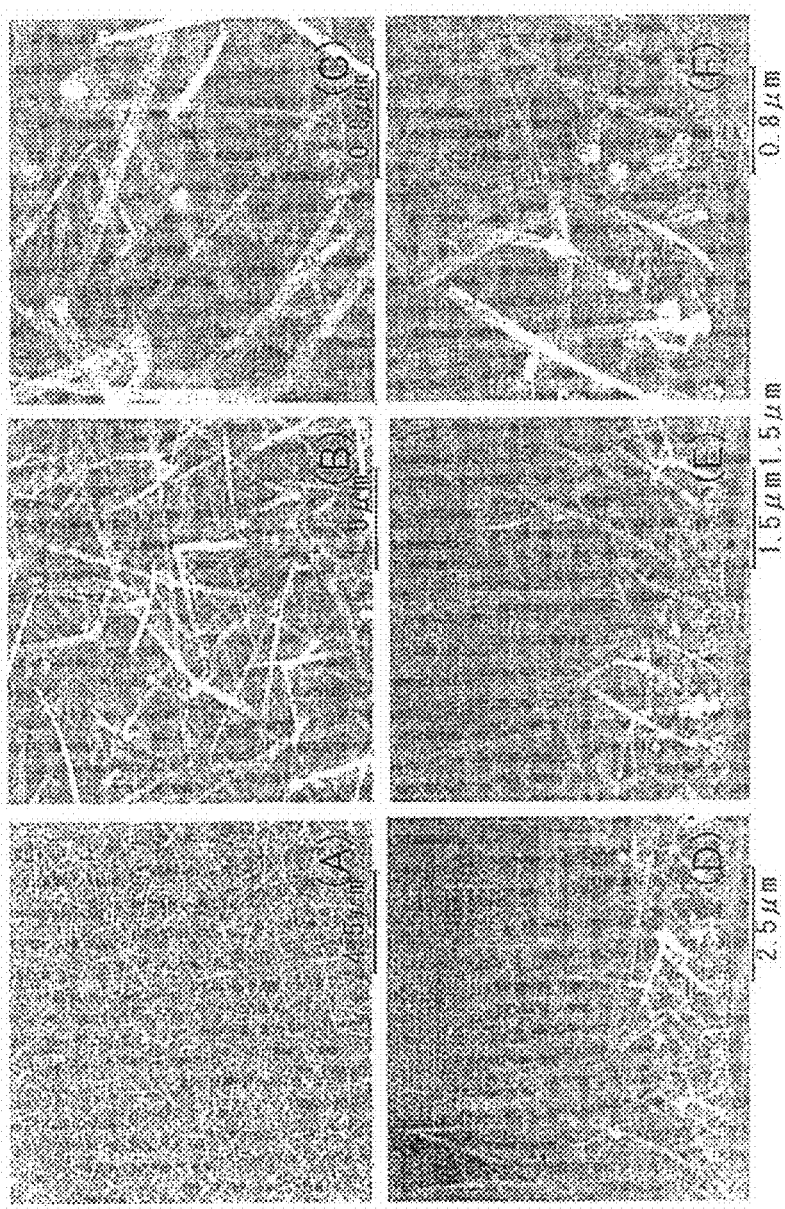
FIG. 12(A)-(F) respectively shows a micrograph of the silicon nanosized linear bodies according to the embodiments 8-13.

FIG. 11 shows a picture indicating that the silicon nanosized linear bodies have the different shapes between the portions depending on the distance to the reaction center when Si is grown on the Al substrate.

EMBODIMENTS 8-13 AND COMPARATIVE EXAMPLE 2

The silicon nanosized linear bodies were produced changing the reaction time in the embodiment 1. The effect of existence or nonexistence of the pretreatment was confirmed. The production result of the silicon nanosized linear bodies is shown in Table 2.

TABLE 2

| Embodiment | Pretreatment | Time(min) | Length(μm) | Diameter of the tube (nm) |
|---|---|---|---|---|
| Embodiment 8 | Y | 5 | 0.7 | 30 |
| Embodiment 9 | Y | 10 | 1.0 | 40 |
| Embodiment 10 | Y | 20 | 2.0 | 60 |
| Embodiment 11 | Y | 40 | 2.5 | 300 |
| Embodiment 12 | Y | 60 | 3.5 | 400 |
| Embodiment 13 | Y | 120 | 4.0 | 500 |
| Comparative Example 2 | N | 120 | ... | ... |

The silicon nanosized linear bodies shown in FIG. 12(A)-(F) are produced by contacting SiH$_4$ and the hydrogen radical with the catalyst In$_2$O$_3$/Sn(ITO) on the silicon nanosized linear body growing substrate 2 for a predetermined time period.

Figure 13:
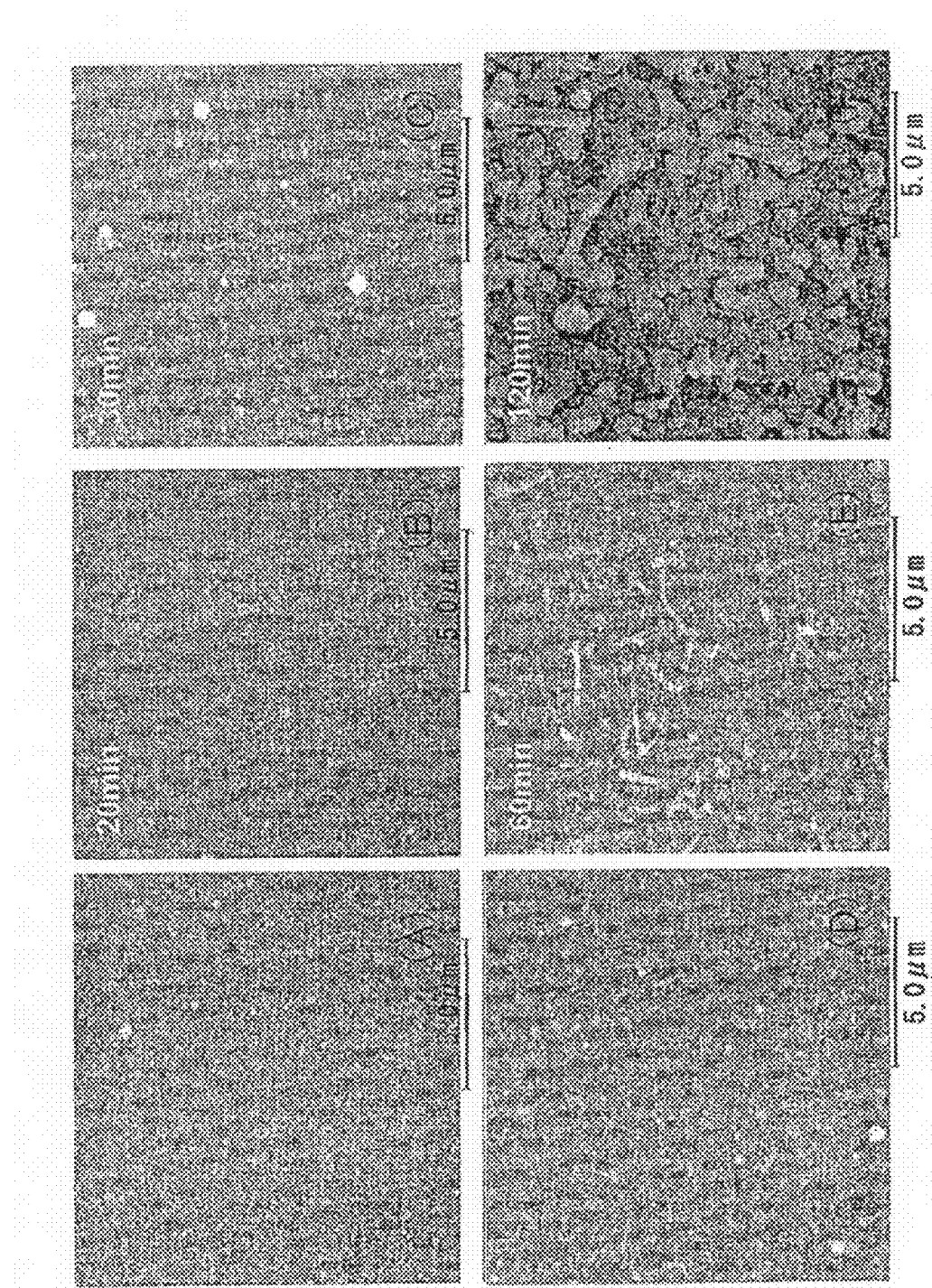
FIG. 13(A)-(F) show the process of production of the silicon nanosized linear bodies on the silicon nanosized linear body growing substrate 2.
Figure 14A:
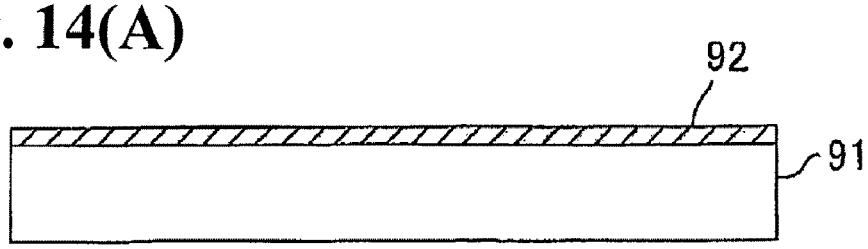
FIG. 14(A)-(D) show the prior art.
Figure 14B:
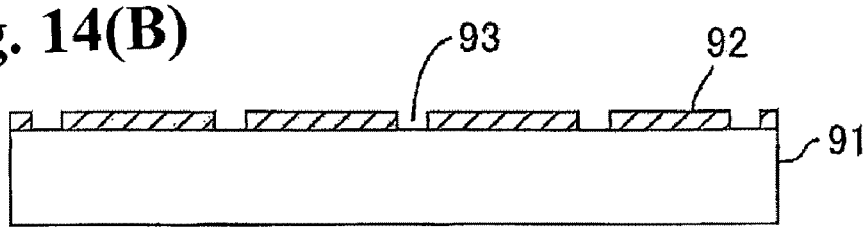
Figure 14C:
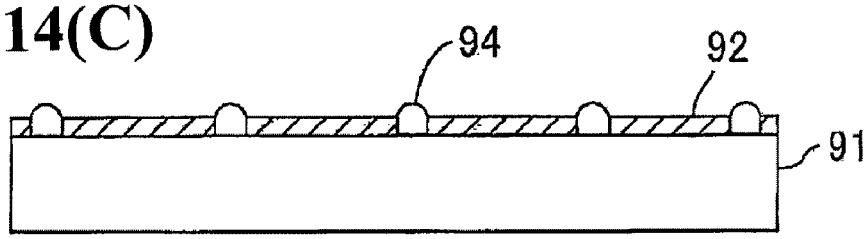
Figure 14D:
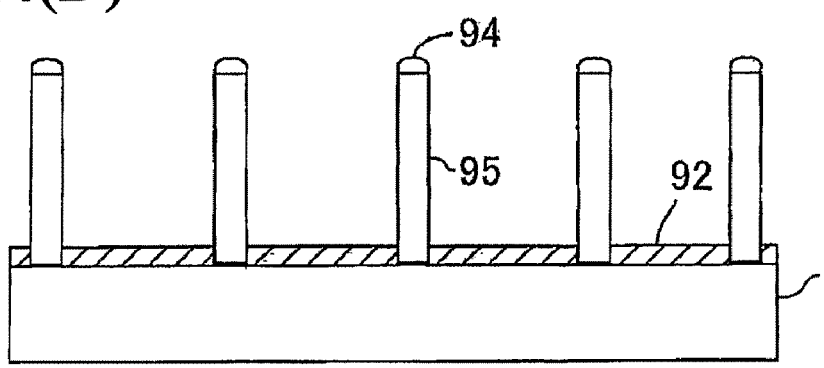

FIGS. 13(A),(B),(C),(D), (E) and (F) respectively shows an electron micrograph picture by the SEM of 5000 magnifications for the observation at the time of (A) 10 [min] from the beginning of the reaction, (B) 10 [min] from the beginning of the reaction, (C) 30 [min] from the beginning of the reaction, (D) 40 [min] from the beginning of the reaction, (E) 60 [min] from the beginning of the reaction and (F) 120 [min] from the beginning of the reaction.

As shown in Table 2 and FIG. 13(A)-(F), the silicon nanosized linear body with the diameter of 30-500 [nm] (longer the growing time period, larger the diameter) was produced in this embodiment. The length of the silicon nanosized linear body was 0.7-4.0 μm at this time.

[For the Structure of the Silicon Nanosized Linear Body]

Table 3 shows the measurement result of the diameter and the length of the silicon nanosized linear bodies produced at the respective temperature based on the electron micrographs observed by the SEM for the silicon nanosized linear bodies produced in the embodiments 1-6.

TABLE 3

| Embodiment run. | Metal compound | Temperature (° C.) | Diameter of the pole (nm) | Length (μm) |
|---|---|---|---|---|
| Embodiment 1 | In$_2$O$_3$/Sn | 350 | 100-300 | 3.5 |
| Embodiment 2 | In$_2$O$_3$/Sn | 450 | 20-150 | 8.0 |
| Embodiment 4 | In | 400 | 300-500 | 12.0 |
| Embodiment 6 | Ga | 480 | 300-3000 | 6.0 |

It is clear from Table 3 that the structure, e.g. the diameter, the length, of the silicon nanosized linear body can be finely controlled by selecting the catalyst metal compound and the reaction temperature.

INDUSTRIAL APPLICABILITY

According to the present invention, silicon nanosized linear bodies with various shapes and properties can be produced by changing the production condition and the silicon nanosized linear bodies are expected to be applied to electronics and property physics, e.g. production of the silicon nanosized linear bodies with semiconductor properties, biotechnologies and healthcare.

According to the present invention, silicon nanosized linear body with different structures and properties can be produced by appropriately setting the condition for pretreatment by a radical (reaction condition of the concentration of hydrogen atoms, hydrogen radicals, etc.) Silicon nanosized linear bodies with different structures and properties can be produced by appropriately changing the reaction condition of silicon radical active species in presence of the catalyst.

The structure and property of a silicon nanosized linear body can be adjusted by appropriately setting the type of the used catalyst, the silicon compound and the hydrogen radical source compound, the concentration of silicon radical active species and hydrogen radicals at the catalyst neighborhood, the pressure and the reaction temperature at the catalyst neighborhood, the reaction time, etc. A less expensive mass production of silicon nanosized bodies can be realized by using a CVD apparatus.

DRAWINGS

FIG. 1

1 CVD apparatus 2 silicon nanosized linear body growing substrate 11 reaction chamber 12 hydrogen feed pipe 13 radicalization apparatus 14 silicon compound feed pipe 15 hydrogen radical radiation aperture 16 table 17 substrate heater 18 outlet tube 21 In compound 22 glass plate 31,32 flow rate adjust valve 33 pump H hydrogen radical

The invention claimed is:

1. A method for producing a silicon nanosized linear body from silicon radical active species in a presence of a catalyst, wherein the catalyst is formed by at least one catalyst primary material selected from the group consisting of Ga, Ga compound, In, In compound, Tl, Tl compound, Al and Al compound and pretreated by a hydrogen radical, said method comprising the steps of:

pretreating the catalyst primary material by the hydrogen radical in a production system for the silicon nanosized linear body;

producing the silicon radical active species by supplying a silicon compound while continuously supplying the hydrogen radical in the production system; and producing the silicon nanosized linear body from the silicon radical active species.

2. A method according to claim 1, wherein the hydrogen radical is produced from a hydrogen radical source compound.

3. A silicon nanosized linear body produced by the method according to claim 1.

* * * * *